(12) United States Patent
Asada

(10) Patent No.: US 8,662,485 B2
(45) Date of Patent: *Mar. 4, 2014

(54) SUCTION APPARATUS, POLISHING APPARATUS, SEMICONDUCTOR DEVICE, AND METHOD OF MANUFACTURING A SEMICONDUCTOR DEVICE

(71) Applicant: Nikon Corporation, Tokyo (JP)

(72) Inventor: Naoki Asada, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/750,874

(22) Filed: Jan. 25, 2013

(65) Prior Publication Data

US 2013/0200559 A1    Aug. 8, 2013

Related U.S. Application Data

(63) Continuation of application No. 11/887,211, filed as application No. PCT/JP2006/303360 on Feb. 17, 2006, now Pat. No. 8,371,564.

(30) Foreign Application Priority Data

Mar. 28, 2005    (JP) ................................. 2005-090297

(51) Int. Cl.
    *B25B 11/00*    (2006.01)
(52) U.S. Cl.
    USPC ........... 269/21; 269/289 R; 269/309; 269/310
(58) Field of Classification Search
    USPC ................. 451/388, 57; 427/352–355, 407.1; 269/289 R, 21, 309–310
    See application file for complete search history.

(56) References Cited

U.S. PATENT DOCUMENTS 1,771,538 A * 7/1930 Hopkins ................. 428/458
2,823,140 A * 2/1958 Lowell ..................... 428/448

(Continued)

FOREIGN PATENT DOCUMENTS

JP    63-073625    4/1988
JP    06-091463    4/1994

(Continued)

OTHER PUBLICATIONS

Notice of Preliminary Rejection issued by Korean Patent Office mailed Apr. 24, 2012 in counterpart Korean application No. 10-2007-7024747.

(Continued)

*Primary Examiner* — George Nguyen
(74) *Attorney, Agent, or Firm* — Finnegan, Henderson, Farabow, Garrett & Dunner, LLP

(57) ABSTRACT

A suction apparatus 1 holds a wafer W by performing vacuum-suctioning on the wafer W. The suction apparatus 1 comprises a suction substrate 2. The suction substrate 2, which is rigid, comprises a plurality of pin-like protrusions 2a formed so that the tip-end faces (upper surfaces) thereof are the same height. An elastic coating layer is coated by way of an undercoat layer 4 on the tip-end faces of the protrusions 2a. When the wafer W is suctioned, even if a foreign matter is interposed between the wafer W and the suction surface, because the foreign matter embeds itself into the coating layer 3, the planarization of the wafer W is improved. In addition, because the coating layer 3 can be made comparatively thinner, undulations in the wafer W can be reduced and, to that end, the planarization of the wafer W in the suctioned state can be improved.

56 Claims, 6 Drawing Sheets

(56) References Cited

U.S. PATENT DOCUMENTS

| | | | |
|---|---|---|---|
| 3,627,338 A * | 12/1971 | Thompson | 279/3 |
| 3,762,939 A * | 10/1973 | Hunter | 428/215 |
| 4,183,545 A * | 1/1980 | Daly | 279/3 |
| 4,778,326 A * | 10/1988 | Althouse et al. | 414/800 |
| 4,906,011 A * | 3/1990 | Hiyamizu et al. | 279/3 |
| 4,965,096 A * | 10/1990 | Deal et al. | 427/165 |
| 5,069,956 A * | 12/1991 | Murata et al. | 428/216 |
| 5,248,521 A * | 9/1993 | Yamane et al. | 427/140 |
| 5,584,746 A * | 12/1996 | Tanaka et al. | 451/41 |
| 5,733,603 A * | 3/1998 | Turkevich et al. | 427/340 |
| 5,766,525 A * | 6/1998 | Andersen et al. | 264/40.1 |
| 6,257,564 B1* | 7/2001 | Avneri et al. | 269/21 |
| 6,365,232 B1* | 4/2002 | Allen | 427/318 |
| 6,491,570 B1 | 12/2002 | Sommer et al. | 451/41 |
| 6,537,143 B1* | 3/2003 | Yang et al. | 451/388 |
| 6,746,318 B2* | 6/2004 | Mallery et al. | 451/285 |
| 6,844,029 B2* | 1/2005 | Okada et al. | 427/492 |
| 7,083,507 B2* | 8/2006 | Togawa et al. | 451/288 |
| 7,744,959 B2* | 6/2010 | Bi et al. | 427/353 |
| 8,371,564 B2* | 2/2013 | Asada | 269/21 |
| 2001/0044019 A1* | 11/2001 | Huesmann | 428/325 |
| 2003/0099835 A1* | 5/2003 | Petrmichl et al. | 428/408 |
| 2004/0175551 A1* | 9/2004 | Dunlop et al. | 428/212 |
| 2005/0074555 A1* | 4/2005 | Kawabe | 427/355 |
| 2005/0123683 A1* | 6/2005 | Thirkeldsen | 427/355 |
| 2005/0210646 A1* | 9/2005 | Metzner et al. | 29/26 A |
| 2005/0247426 A1* | 11/2005 | Flynn | 164/98 |
| 2005/0266277 A1* | 12/2005 | Tomaru et al. | 428/840.1 |
| 2006/0128871 A1* | 6/2006 | Ashikaga | 524/507 |
| 2009/0274841 A1* | 11/2009 | Mihelic | 427/354 |

FOREIGN PATENT DOCUMENTS

| | | |
|---|---|---|
| JP | 10-050810 | 2/1998 |
| JP | 10-229115 | 8/1998 |
| JP | 2002-217141 | 8/2002 |
| JP | 2004-259792 | 9/2004 |

OTHER PUBLICATIONS

Notice of Final Rejection issued by Korean Patent Office mailed Oct. 10, 2012 in counterpart Korean application No. 10-2007-7024747.
Notice of Preliminary Rejection issued by Korean Patent Office mailed May 2, 2013 in counterpart Korean application No. 10-2013-7000770.

* cited by examiner

SUCTION APPARATUS, POLISHING APPARATUS, SEMICONDUCTOR DEVICE, AND METHOD OF MANUFACTURING A SEMICONDUCTOR DEVICE

CROSS-REFERENCE TO RELATED APPLICATIONS

This application claims priority to and benefit from U.S. application Ser. No. 11/887,211, filed Sep. 26, 2007, U.S. Pat. No. 8,371,564, which claims priority to and benefit from International Application No. PCT/JP06/303360, filed Feb. 17, 2006, which claims priority to and benefit from Japanese Patent Application No. 2005-090297, filed Mar. 28, 2005, all of which are incorporated herein by reference in their entireties.

FIELD OF THE INVENTION

The present invention relates to a suction apparatus for holding a material to be suctioned such as a wafer or other substrate by vacuum-suctioning the material to be suctioned, a polishing apparatus that employs this suction, and a semiconductor device and method of manufacturing a semiconductor device.

BACKGROUND OF THE INVENTION

In conventionally known suction apparatuses for holding a material to be suctioned such as a wafer or other substrate by vacuum-suctioning the material to be suctioned, a rigid suction substrate comprising a plurality of pin-like or ridged protrusions of which the tip-end faces thereof are the same height is formed on the side of the suction apparatus to which the material to be suctioned is suctioned (for example, Japanese Unexamined Patent Application Publication Nos. 2002-217141 and H10-50810).

In these suction apparatuses, a negative pressure is created in depressions between the protrusions in a state in which the tip-end faces of the protrusions are in contact with a wafer to ensure the wafer is held planarly against the tip-end faces of the protrusions. A suction surface where the tip-end faces of the protrusions are held in contact with the wafer is established in the suction apparatus in this way.

When a foreign material becomes interposed between the wafer and the suction surface of the suction apparatus, the wafer deforms and forms a bulge in proximity of the location of the foreign material that, in turn, results in various undesirable outcomes. For example, when polishing is performed to planarize the wafer, excessive polishing will occur in the location in which the bulge has been produced by the foreign material and will result in a fatal defect thereof. Although the wafer and the suction surface of the suction apparatus are normally washed, it is impossible to completely remove such foreign materials.

Because the contact surface area between the wafer and the suction surface is limited to the surface area of the tip-end faces of the protrusions in the aforementioned conventional suction apparatuses disclosed in Japanese Unexamined Patent Application Publication Nos. 2002-217141 and H10-50810, a highly desirable marked reduction in the probability of a foreign material such as dust or polishing agent becoming interposed between the wafer and the suction surface is afforded thereby.

Although the contact surface area between the wafer and the suction surface of the aforementioned conventional suction apparatuses disclosed in Japanese Unexamined Patent Application Publication Nos. 2002-217141 and H10-50810 can be regarded as small, the possibility that a foreign material will become interposed therebetween cannot be completely eliminated. When a foreign material becomes interposed between the wafer and the tip-end faces of the protrusions in the aforementioned conventional suction apparatuses, as described above, the wafer deforms and forms a bulge in proximity of the location of the foreign material which, in turn, results in various undesirable outcomes.

Japanese Unexamined Patent Application Publication No. 2004-259792 proposes an elastic layer affixed to the tip-end faces of the aforementioned protrusions. More specifically, a non-woven fabric of thickness of the order of several hundred μm is employed as the aforementioned elastic layer and is adhered to the tip-end faces of the protrusions using a double-side adhesive tape. A case in which the aforementioned non-woven fabric is arranged on the tip-end faces only of the aforementioned protrusions (FIG. 1 of Japanese Unexamined Patent Application Publication No. 2004-259792), and a case in which the aforementioned non-woven fabric is connectively formed in an overall sheet-like shape and laid across the top of the depressions between the aforementioned protrusions and in which a plurality of through-holes that afford through-connection of the aforementioned depressions to the side of the material to be suctioned that is suctioned are formed in the aforementioned non-woven fabric (FIG. 7 of Japanese Unexamined Patent Application Publication No. 2004-259792) have been proposed.

If a foreign material such as dust becomes interposed between the suction-held wafer and the aforementioned elastic layer when the aforementioned elastic layer has been affixed to the top of the tip-end faces of the aforementioned protrusions in this way, because the foreign material attempts to embed itself in the aforementioned elastic layer due to the elasticity of the aforementioned elastic layer, the bulge in the wafer in proximity of the location of the foreign material is comparatively less than when there is no aforementioned elastic layer provided and, to that end, the planarization of the suction-held wafer can be improved.

However, in the aforementioned conventional art proposed in Japanese Unexamined Patent Application Publication No. 2004-259792, because a double-sided tape is used to adhere the non-woven fabric to the top of the tip-end faces of the protrusions, a comparative increase in the thickness of the non-woven fabric of several hundred μm is unavoidable. However, it is apparent that when a condition in which different pressure is applied to the various areas of the non-woven fabric (this condition is generated by, for example, relative movement between the wafer and the polishing pad during polishing performed to planarize the wafer.) arises when the thickness of the non-woven fabric is made comparatively thicker in this way, comparatively greater differences in the thickness of the various areas of the non-woven fabric are produced and, originating therein, undulations are produced in the wafer that, in turn, lead to lowering of the planarization of the wafer.

In addition, in the aforementioned case depicted in FIG. 7 of Japanese Unexamined Patent Application Publication No. 2004-259792 of the aforementioned conventional art proposed in Japanese Unexamined Patent Application Publication No. 2004-259792, it is apparent that because the non-woven fabric is connectively formed in an overall sheet-like shape and laid across the top of the depressions between the protrusions and a plurality of through-holes that afford through-connection of the aforementioned depressions to the side of the material to be suctioned which is suctioned are formed in the aforementioned non-woven fabric, undulations are generated in the regions in which the non-woven fabric is laid across the depressions between a location in proximity of the aforementioned through-holes on which a suction force has action and the remaining locations and, originating therein, undulations are produced in the wafer that, in turn, lead to lowering of the planarization of the wafer. Also, in the aforementioned case depicted in FIG. 1 of Japanese Unexamined Patent Application Publication No. 2004-259792, while there is an absence of undulations generated in the wafer for the reason that the on-woven fabric is arranged only in the tip-end faces of the aforementioned protrusions, arrangement of the non-woven fabric in the tip-end faces only of the aforementioned protrusions is, from the manufacturing standpoint, very difficult to implement in actual practice.

As is described above, in the aforementioned conventional art proposed in the aforementioned Japanese Unexamined Patent Application Publication No. 2004-259792, irrespective of whether or not the generation of bulges in the wafer in proximity of the location of a foreign material can be reduced by provision of a non-woven fabric and, in turn, the planarization of the wafer can be improved, the planarization of the wafer can be lowered for a reason originating in the non-woven fabric that is unrelated to the presence of a foreign material.

While the description provided above pertains to an example in which the material to be suctioned is a wafer, the same applies to other materials to be suctioned.

SUMMARY OF THE INVENTION

With the foregoing conditions in mind, it is an object of the present invention to provide a suction apparatus able to reduce the effect caused by foreign materials and, moreover, able to increase the planarization of the material to be suctioned in the suctioned state.

It is an additional object of the present invention to provide a polishing apparatus able to prevent localized excessive polishing.

It is a further object of the present invention to provide a method of manufacturing a semiconductor device able to manufacture a semiconductor device with better yield and at lower cost than a conventional method of manufacturing a semiconductor device, and to provide a low cost semiconductor device.

In order to resolve the aforementioned problems, a suction apparatus for holding a material to be suctioned by vacuum-suctioning the material to be suctioned of the suction apparatus of a first embodiment of the present invention comprises a rigid suction substrate comprising, on a side to which said material to be suctioned is suctioned, a plurality of protrusions formed so that tip-end faces thereof are substantially the same height; and at least one elastic coating layer coated on said suction substrate on said side to which said material to be suctioned is suctioned.

It is preferable that at least one undercoat layer is formed between the aforementioned coating layer and the aforementioned suction substrate.

It is preferable that a region of a surface region, of the coating layer, correspondent to the tip-end faces of the plurality of protruding parts is polished.

It is preferable that a region, of a surface region of the coating layer, correspondent to said tip-end faces of said plurality of protruding parts are polished, and that the combined thickness of the coating layer and the undercoat layer following polishing is not less than 40 μm and not more than 90 μm.

It is preferable that the coating layer is configured from a paint film.

It is preferable that at least an uppermost layer of the coating layer is configured from a polyurethane-based resin, acrylic-based resin or fluorine-based resin.

It is preferable that a pencil hardness of the coating layer according to JIS K5600-5-4 is substantially H.

It is preferable that the plurality of protrusions are formed in a pin shape or as ridges.

In addition, a polishing apparatus pertaining to the present invention is configured to polish a material to be polished by, while applying load between a polishing body and said material to be polished held by a suction apparatus, causing relative movement between said polishing body and said material to be polished.

Furthermore, a method of manufacturing a semiconductor device pertaining to the present invention comprises the step of planarizing a surface of a semiconductor wafer employing this polishing apparatus.

Furthermore, a semiconductor device pertaining to the present invention is manufactured by this method of manufacturing a semiconductor device.

According to the present invention described above, a suction apparatus able to reduce the effect caused by foreign materials and, moreover, able to increase the planarization of the material to be suctioned in the suctioned state can be provided.

In addition, according to the present invention, a polishing apparatus able to prevent localized excessive polishing can be provided.

Furthermore, a method of manufacturing a semiconductor device able to manufacture a semiconductor device with better yield and at lower cost than a conventional method of manufacturing a semiconductor device, and a low cost semiconductor device can be provided.

DESCRIPTION OF THE PREFERRED EMBODIMENTS

The suction apparatus, polishing apparatus, semiconductor device and method of manufacturing a semiconductor device of the present invention will be hereinafter described in detail with reference to the drawings.

FIRST EXAMPLE

Figure 1:
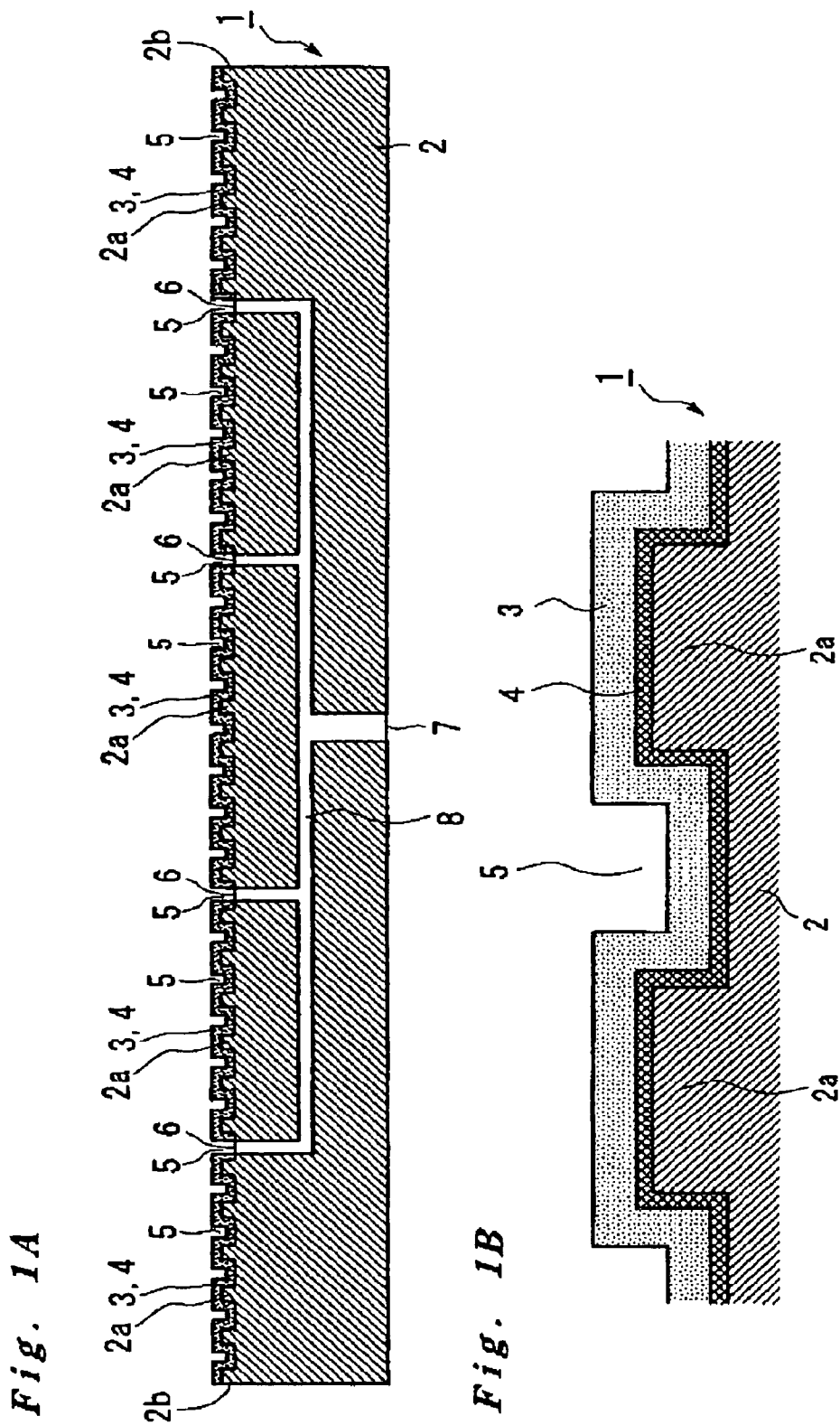
FIG. 1A is a schematic cross-sectional view of a first embodiment of a suction apparatus of the present invention.
FIG. 1B is a partially expanded schematic cross-sectional view of FIG. 1A.
Figure 2:
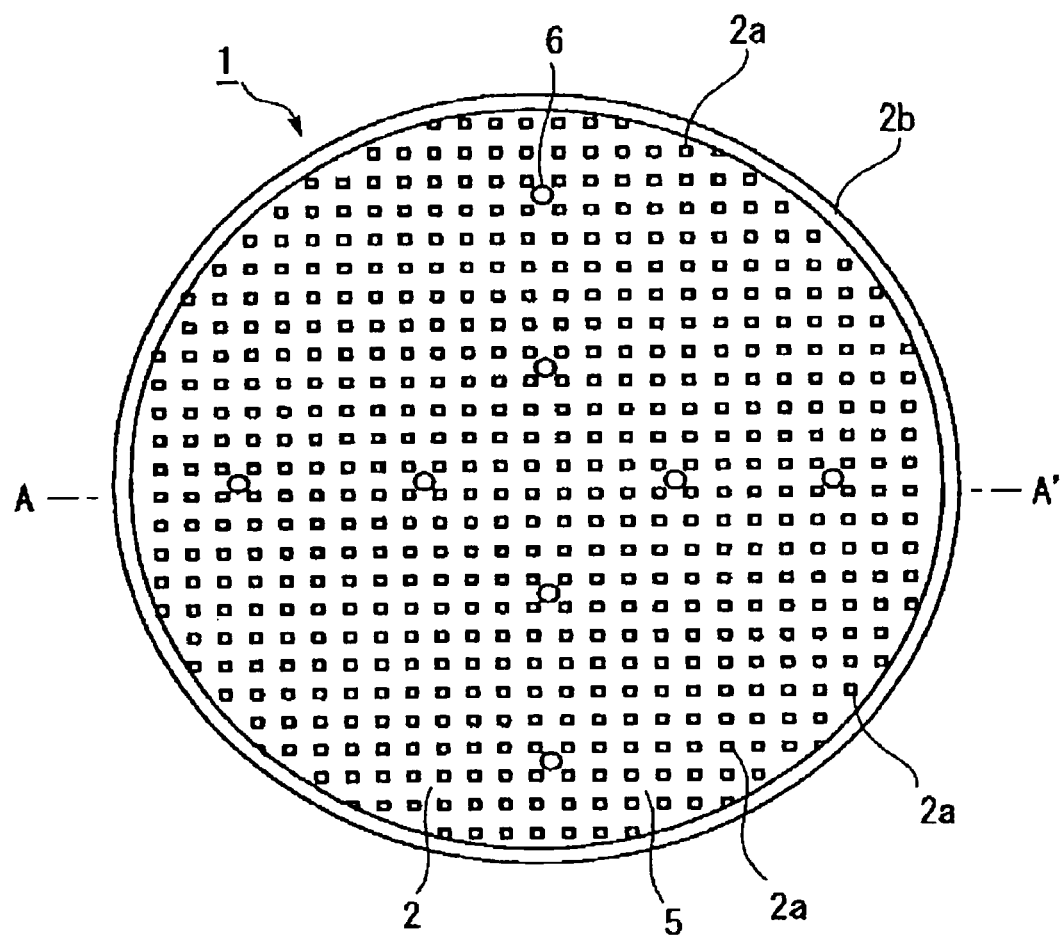
FIG. 2 is a schematic cross-sectional view of the suction apparatus of FIG. 1.

FIG. 1(a) is a schematic cross-sectional view of a suction apparatus 1 of a first embodiment of the present invention. FIG. 1(b) is a partially expanded schematic cross-sectional view of FIG. 1(a). FIG. 2 is a schematic cross-sectional view of the suction apparatus 1 of FIG. 1. A coating layer 3 and undercoat layer 4 have been omitted from the illustration of FIG. 2.

The suction apparatus 1 of this embodiment is configured to suction-hold a wafer W serving as a material to be suctioned, that is to say, it is configured as a wafer chuck.

As shown in FIG. 1 and FIG. 2, this suction apparatus 1 comprises a disk-like suction substrate 2, a coating layer 3, and an undercoat layer 4.

The suction substrate 2 is configured from, for example, a ceramic such as alumina or stainless steel and is rigid. A large number of pin-like protrusions 2a are formed in a upper-surface side (side to which the material to be suctioned is suctioned) of the suction substrate 2. These protrusions 2a are evenly distributed over the entire upper surface of the suction substrate 2 (planarity: of the order of, for example, 1 μm). In addition, a ring-shaped ridge-like protrusion 2b is also formed around the outer perimeter of the upper-surface side of the suction substrate 2. The height of the upper surface (tip-end face) of all the protrusions 2a, 2b is the same, these upper surfaces being located with high accuracy in the same plane. For example, the height of the protrusions 2a, 2b is of the order of several 100 μm, the width of the protrusions 2a, 2b (while in the example shown in the diagram the protrusions 2a describe a square shape in the plane view, if circular in shape this denotes the diameter of the protrusions 2a) is of the order of 500 μm, and the pitch of the protrusions 2a is of the order of 800 μm.

Because the contact surface area between the wafer W and the suction apparatus 1 is significantly reduced and the load per unit surface area applied to the wafer W is markedly increased when the pitch of the protrusions 2a is too large and, in turn, the distribution density of the protrusions 2a is too small, there is a concern that a minute unevenness in shape generated in a region correspondent to the upper surface of the protrusions 2a of the upper surface region of the coating layer 3 of the suction apparatus 1 (although, as is described later, the region correspondent to the upper surface of the protrusions 2a of the surface region of the coating layer 3 is polished to afford the planarization thereof, minute unevenness in shape remains due to incomplete planarization.) will be transferred to the wafer which in turn will result in a lowering of the planarization of the held wafer W. Accordingly, the pitch of the protrusions 2a is set to an appropriate value that is not too large.

Through-holes 6 are provided in a plurality of locations in the upper-surface side of the suction substrate 2 in depressions 5 between the protrusions 2a, 2b. The coating layer 3 and undercoat layer 4 are formed to prevent blocking of these through-holes 6. A connection hole 7 is provided in the lower surface of the suction substrate 2. A through-path 8 that affords through-connection between these through-holes 6 and the connection hole 7 is formed in the interior of the suction substrate 2. FIG. 1(a) shows a cross section along the line A-A' of FIG. 2. While the through-holes 6, connection hole 7 and through-path 8 are not illustrated in the cross section of the latter of these diagrams, for ease of understanding thereof they are each illustrated in FIG. 1(a).

As shown in FIG. 1(b), the coating layer 3 which is elastic and configured in at least one layer is coated on the upper-surface side (wafer W side) of the suction substrate 2 by way of the undercoat layer 4. The coating layer 3 may be configured in a single layer, or it may be configured in a laminated plurality of layers. In addition, while the coating layer 3 may be configured from a paint film, it should not be regarded as being limited thereto.

In order to further reduce the effects of a foreign material 20 (described later with references to FIG. 3(b)) such as dust between the wafer W and the suction surface, it is preferable that the lead hardness of the coating layer 3 pursuant to JIS K5600-5-4 is approximately H.

More specifically, the coating layer 3 can be configured from, for example, a polyurethane resin, acrylic-based resin or fluorine-based resin. If the coating layer 3 is configured from a plurality of layers, the uppermost layer may be configured from any one of the either the polyurethane resin, acrylic-based resin or fluorine-based resin material and the layers other than the uppermost layer configured either from one of the other materials or from a material the same as the uppermost layer. If chemical resistance and outgas generation prevention characteristics are demanded from the viewpoint of the usage environment and the usage purpose and so on, the materials to be used for the coating layer 3 should be selected as appropriate in accordance with these demands.

It is preferable that the thickness of the coating layer 3 be made comparatively thinner in the section of the upper surface of the protrusions 2a, 2b by the order of several tens of μm. In instances when a condition in which different force is applied to the various areas of the section of the upper surface of the protrusions 2a, 2b of the coating layer 3 is generated when the thickness thereof is made comparatively thicker by several hundred μm or more, a comparatively greater difference in the thickness of these areas is produced and, originating therein, undulations are produced in the wafer W. These undulations in the wafer W can be reduced by making the thickness of the section of the upper surface of the protrusions 2a, 2b of the coating layer 3 comparatively thinner because doing this results for the most part in the thickness of the areas in question being unchanged.

With consideration to the difficulty associated with directly coating the coating layer 3 on the suction substrate 2 with good adhesion, in this embodiment the undercoat layer 4 is formed therebetween to improve the adhesion therebetween. The undercoat layer 4 may be formed in a single or a plurality of layers. The material used, for the undercoat layer 4 is selected in accordance with the material of the suction substrate 2 and the material of the coating layer 3 in order to improve the adhesion between therebetween. In some instances, the undercoat layer 4 may not be necessary.

In addition, in this embodiment, the overall planarity in the region correspondent to the upper surface of the protrusions 2a, 2b of the surface region of the coating layer 3 (region of the section of the upper surface of the protrusions 2a, 2b of the coating layer 3) is improved by polishing. This polishing may be a planarization polishing performed employing a lap lathe and a polishing liquid. This polishing affords a planarity thereof of the order of, for example, 1 μm. It is preferable that the planarization of the region correspondent to the upper surface of the protrusions 2a, 2b of the coating layer 3 be unproved by polishing in this way because it affords both further reduction in the undulations of the wafer W and, in turn, an improvement in the planarization of the suction-held wafer W. In the present invention this coating layer 3 need not necessarily be polished.

For polishing of the coating layer 3 in this way, it is preferable that a non-bead-containing coating material be employed as the coating layer 3 material (more particularly, the material of the layer that forms the uppermost layer following polishing). This is because, while a bead-containing coating material is often employed in order to lower hardness, because of the comparatively large bead particle diameter and, moreover, the comparatively large dispersion in bead particle diameter, subsequent to polishing the beads may protrude in a semi-circular shape and semi-circular shape trace marks of the beads may be formed which, accordingly, makes improving planarization difficult. Of course a bead-containing coating material may be employed in the present invention.

One example of a method for manufacturing the suction apparatus 1 of this embodiment will be hereinafter described.

First, a suction substrate 2 of the structure described above, is prepared. As with the structure described above, the planarization of the protrusions is of the order of 1 μm, the height of the protrusions 2a, 2b is of the order of several 100 μm, the width of the protrusions 2a, 2b is of the order of 500 μm, and the pitch of the protrusions 2a is of the order of 800 μm.

Next, a primer serving as the undercoat layer 4 is coated on the upper-surface side of the suction substrate 2 using a spray can or similar, and then the volatile component of the primer is volatilized by drying at a predetermined temperature. The undercoat layer 4 is formed in a thickness of the order of, for example, 10 μm to 20 μm.

Thereafter, a polyurethane-based resin, acrylic-based resin or fluorine-based resin coating material serving as the coating layer 3 is coated on the undercoat layer 4 using a spray can or similar. It is preferable that the coating material is coated at this time in the number of layers required to as far as possible ensure uniformity of thickness. The coating material is then baked at a predetermined temperature. This ends the process for coating the coating layer 3. The thickness of the coating layer 3 of this embodiment taken to be, for example, 80 μm to 100 μm, and the total film thickness of the undercoat layer 4 and the coating layer 3 in this state is taken to be of the order of 120 μm.

Thereafter, regions correspondent to the upper surface of the protrusions 2a, 2b of the surface region of the coating layer 3 are collectively polished employing a lap lathe and polishing liquid to planarize these regions in question of the coating layer 3. The total film thickness of the coating layer 3 and undercoat layer 4 in this region following this polishing is, for example, preferably 40 μm to 90 μm, and more preferably 60 μm to 80 μm. Because, when the total film thickness of the coating layer 3 and undercoat layer 4 of this region following this polishing exceeds 90 μm a condition in which, as is described above, different force is applied to the various areas of the section of the upper surface of the protrusions 2a, 2b of the coating layer 3 is generated, a cooperatively greater difference in the thickness of these areas is produced and, originating therein, undulations are produced in the wafer W, the total film thickness is preferably no more than 90 μm.

Next, the suction substrate 2 in this state is washed by ultrasonic washing or the like. With this, the fabrication of the suction apparatus 1 is completed.

Figure 3A:
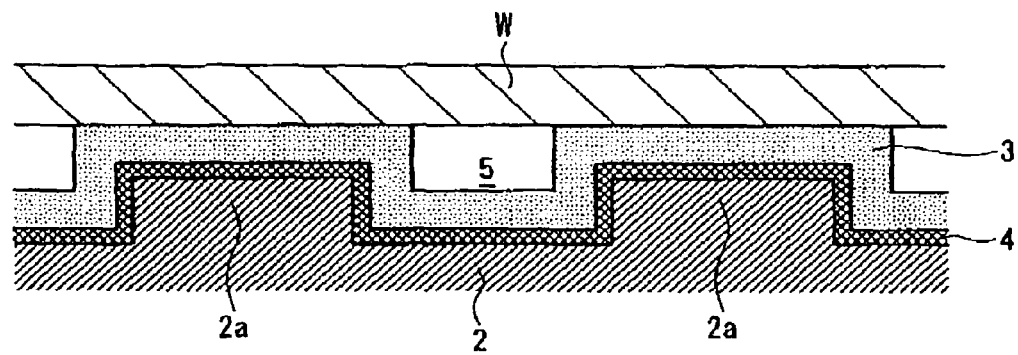
FIG. 3A is a schematic cross-sectional view that schematically shows a state in which a wafer is suctioned in the suction apparatus of FIG. 1 in a case in which there is no foreign material between the wafer and the suction surface.

When the wafer W is held by auctioning by the suction apparatus 1 of this embodiment, the wafer W is mounted on the upper surface of the coating layer 3. In addition, a negative pressure is created in a space between the depressions 5 by a vacuum pump (not shown in the diagram) connected by way of a connecting path connected to the connection hole 7. As a result, as shown in FIG. 3, the wafer W is held by vacuum-suctioning on the coating layer 3. FIG. 3 is a schematic cross-sectional view schematically showing a state in which the wafer W is suctioned in the suction apparatus 1 shown in FIG. 1. FIG. 3(a) shows a case in which there is no foreign material 20 such as dust between the wafer W and the suction surface, and FIG. 3(b) shows a case when a foreign material 20 is present therebetween.

At this time, as shown in FIG. 3(a), when there is no foreign material 20 interposed between the wafer W and the coating layer 3, the lower surface of the wafer W is planarly held. This is because the coating layer 3 is supported by the rigid protrusions 2a, 2b of uniform upper surface height. In addition, as shown in FIG. 3(b), when a foreign material 20 of, for example, a magnitude pm is interposed between the wafer W and the coating layer 3, the lower surface of the wafer W is also planarly held. This is because, due to the elasticity of the coating layer 3, the foreign material 20 tries to embed itself in the coating layer 3. In order for the lower surface of the wafer W to be planarly hold in cases in which a foreign material 20 of, for example, magnitude pm is interposed between the wafer W and the coating layer 3 in this way, as is described above, the total film thickness of the coating layer 3 and the undercoat layer 4 of the regions in question following planarization by polishing is preferably no less than 40 μm.

Figure 4:
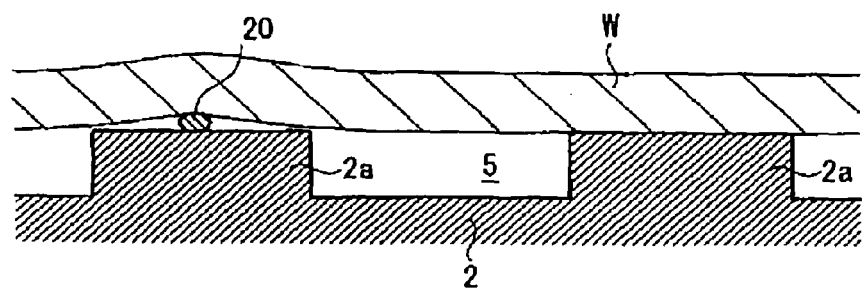
FIG. 4 is a schematic cross-sectional view that schematically shows a state in which a wafer is suctioned in a suction apparatus of a comparative example.

Here, by way of comparison with the suction apparatus 1 of this embodiment, a suction apparatus of a comparative example will be described. This comparative example constitutes a suction apparatus in which the undercoat layer 4 and the coating layer 3 have been removed from the suction apparatus 1 shown in FIG. 1. FIG. 4 is a schematic cross-sectional view that schematically shows a wafer W in a suctioned state in the suction apparatus of the comparative example, a case in which a foreign material 20 exists between the wafer W and the suction surface being depicted thereby.

In this comparative example, when a foreign material 20 is interposed between the wafer W and the protrusions 2a, 2b (protrusions 2a in the example shown in the diagram), due to the rigidity of the protrusions 2a, 2b, the wafer W deforms in the vicinity of the location of a foreign material 20 and forms a bulge as shown in FIG. 4.

While in the comparative example the wafer W deforms in the vicinity of the location of a foreign material 20 interposed between the wafer W and the suction surface in this way, in this embodiment, even if a foreign material 20 becomes interposed between the wafer W and the suction surface, deformation of the wafer W due to the foreign material 20 does not occur and the lower surface of the wafer W (surface thereof which is suctioned) can be planarized. According to this embodiment, the effect of a foreign material 20 can be reduced and the planarization of a wafer W in the suctioned state disproved in this way.

In addition, in the suction apparatus 1 of this embodiment, as can be easily understood by comparison between FIG. 3(b) and FIG. 4, because the force at which tine foreign material 20 is thrust into the rear surface (lower surface) of the wafer W is weakened; the foreign material 20 can be more easily removed from the wafer W when it is subsequently washed.

Furthermore, based on the same principle as applies when a foreign material 20 is interposed between the wafer W and the suction surface, even if the rear surface of the wafer W (surface thereof suctioned onto the side of the suction apparatus 1) has been damaged in sane way, because the shape of this damage is prevented from being transferred onto the upper surface of the wafer W, the planarization of the wafer W in this suctioned state (more particularly, the planarization of the opposing surface (upper surface) to the surface to be suctioned of the wafer W) can be improved.

Furthermore, because the coating layer 3 of the suction apparatus 1 of this embodiment is elastic, the wafer W is protected by the coating layer 3 during loading and unloading of the wafer W and, accordingly, compared to when no coating layer 3 is provided as is the case in the comparative example shown in FIG. 4, the rear surface of the wafer W is unlikely to be damaged during loading and unloading thereof.

Because the coating layer 3 of the suction apparatus 1 of this embodiment is formed without use of the non-woven fabric adopted in the technology proposed in Japanese Unexamined Patent Application Publication No. 2004-259792, the thickness of the coating layer 3 can be made comparatively thinner, the thickness thereof being made comparatively thin. Even if a condition in which different force is applied to the various areas of the section of the upper surface of the protrusions 2a, 2b of the coating layer 3 is generated, because there is essentially no difference in the thickness of these areas, undulations of the wafer W can be reduced and, to that end, the planarization of the wafer W in the suctioned state can be improved.

In addition, different to the use of a non-woven fabric adhered using a double-sided tape, because the coating layer 3 is coated onto the suction substrate 2 in the suction apparatus 1 of this embodiment, the coating layer 3 has better close-adhesion to the suction substrate 2 and, accordingly, the coating layer 3 is unlikely to peel off.

Furthermore, provided a polyurethane resin, acrylic-based resin or fluorine-based resin is employed as the material of the uppermost layer of the coating layer 3 in the suction apparatus 1 of this embodiment, because of the high friction coefficient thereof, even when the wafer W is polished using the polishing apparatus shown in the later-described FIG. 6 with the wafer W suctioned at a low vacuum pressure, the wafer is W is unlikely to slip off.

Furthermore, provided a polyurethane resin, acrylic-based resin or fluorine-based resin is employed as the uppermost layer material of the coating layer 3 of the suction apparatus 1 of this embodiment, utilizing the mechanical characteristics thereof, the coating layer 3 can be washed using a simple method involving the use of a brash or similar.

SECOND EXAMPLE

Figure 5:
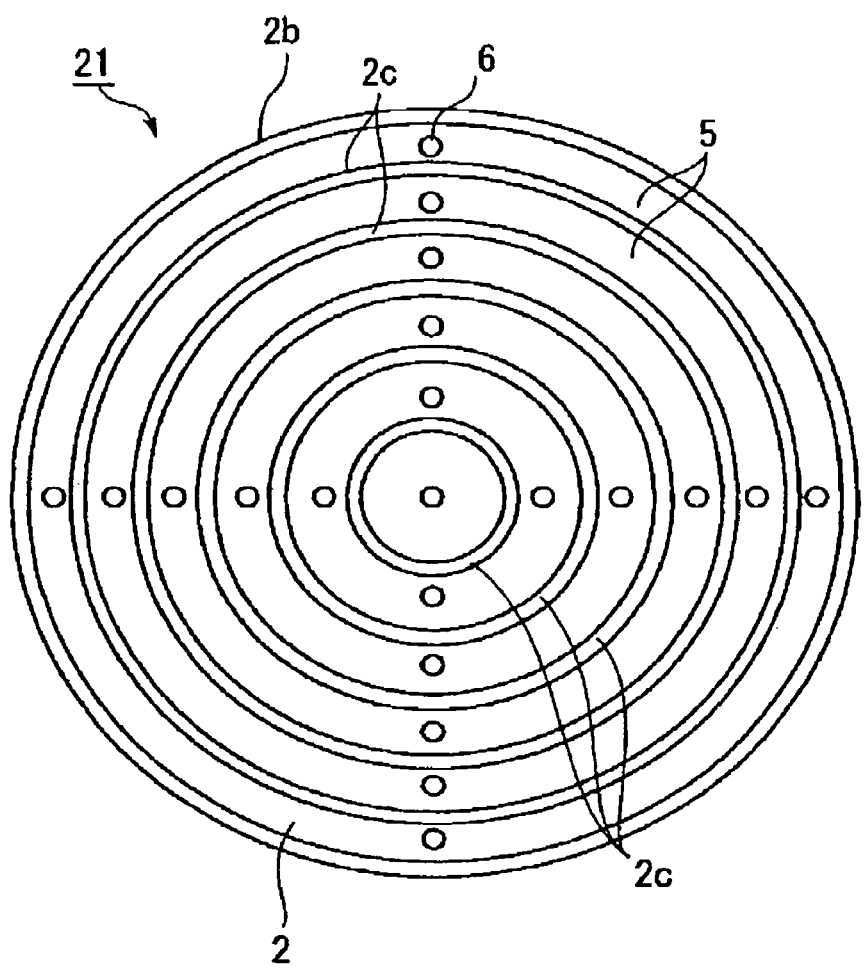
FIG. 5 is a schematic plan view of a second embodiment of a suction apparatus of the present invention.

FIG. 5 is a schematic cross-sectional view of a suction apparatus 21 of a second embodiment of the present invention correspondent to FIG. 2. Elements of FIG. 5 identical to the elements of FIG. 1 and FIG. 2 are denoted using identical symbols and a repetition of the description thereof has teen emitted. In FIG. 5, similarly to FIG. 2, the illustration of the coating layer 3 and undercoat layer 4 has been omitted.

The suction apparatus 21 of this embodiment differs from the suction apparatus 1 of the first embodiment described above in that a plurality of ring-like ridges protrusions 2c are formed in the upper surface of the suction substrate 2 instead of pin-like protrusions 2a, and in that, the number and arrangement of the through-holes 6 has been altered in accordance therewith. The plurality of protrusions 2c are arranged concentrically with the ring-like ridge protrusion 2b arranged in the outer perimeter part. While not shown in the diagram, the coating layer 3 of this embodiment is coated by way of the undercoat layer 4 on the upper-surface side of the suction substrate 2 to also cover the upper surface of the protrusions 2c.

The advantages afforded by this embodiment are identical to those of the first, embodiment described above.

The pattern of the protrusions on the suction substrate 2 is not limited to the patterns depicted in these suction apparatuses 1, 21. For example, the protrusions 2c shown in FIG. 5 may be formed in an interrupting pattern in the circumferential direction (for example, in a position every 90 degrees of the angle).

THIRD EXAMPLE

Figure 6:
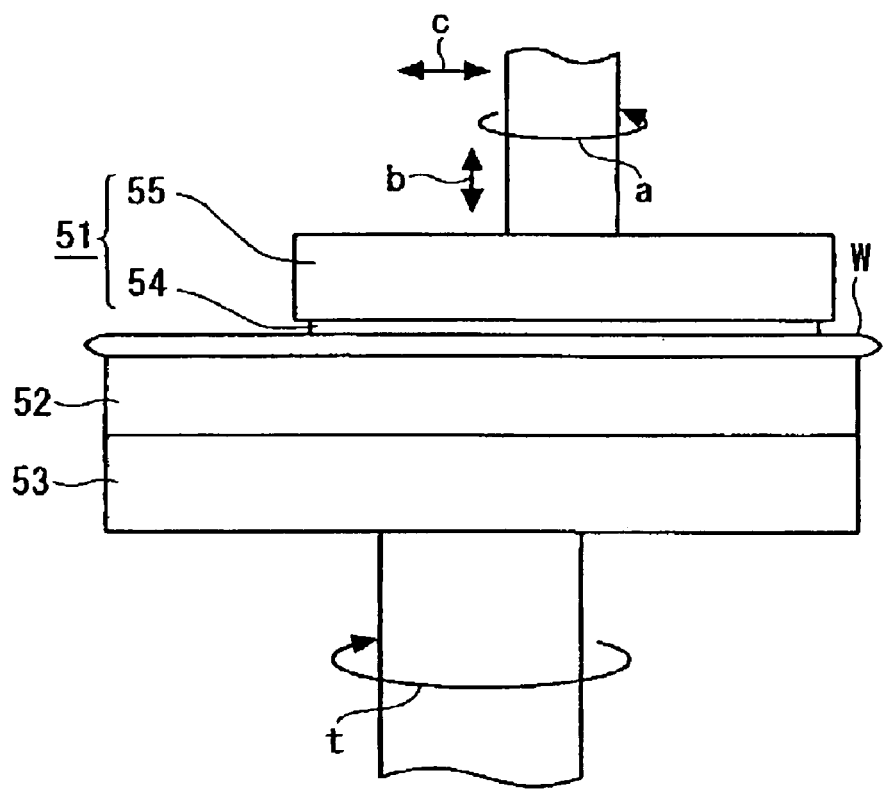
FIG. 6 is a schematic block diagram that schematically shows a polishing apparatus of a third embodiment of the present invention.

FIG. 6 is a schematic cross-sectional view that schematically shows a polishing apparatus of a third embodiment of the present invention.

The polishing apparatus of this embodiment comprises a polishing tool 51, a wafer chuck 52 for holding a wafer serving as the material to be suctioned on the lower side of the polishing tool 51, and a polishing agent supply unit (nest, shown in the diagram! for supplying a polishing agent (slurry) between the wafer W and polishing tool 51 by way of a supply path formed in the polishing tool 51 (not shown in the diagram).

Using a mechanism not shown in the diagram employing an electric motor or the like as an actuator, the polishing tool 51 can be rotated and oscillated (reciprocally moved) up and down and left to right as shown by the arrows a, b, c of FIG. 6. The wafer chuck 52 can foe rotated as shown by the arrow t shown in FIG. 6 by a rotating table 53 not shown in the diagram employing a power rotor or the like as an actuator. While not shows in the diagram, the connection hole 7 (see FIG. 1) of the wafer chuck 52 is connected to the vacuum pump (not shown in the diagram) by way of a through-path in the rotating table 53. The polishing tool 51 comprises a polishing body 54 configured from a polishing pad or the like, and a substrate 55 on which the opposing side surface (upper surface of FIG. 6) of the polishing surface (lower surface of FIG. 6) of the polishing body 54 is supported.

In addition, either of the suction apparatuses 1 or 21 of the first and second embodiments described above may be employed as the wafer chuck 52 in this embodiment.

The polishing of the wafer W of this embodiment will be hereinafter described. The polishing tool 51, while oscillating and rotating, pushes the polishing body 54 of the polishing tool 51 at a predetermined force (load) against the upper surface of the wafer W on the wafer chuck 52. The wafer chuck 52 is rotated by the rotating table 53 causing the wafer W to rotate and, in turn, causing relative movement between the wafer W and polishing tool 51. In this state, a polishing agent dispersed and used to polish the surface to be polished of the wafer W is supplied between the wafer W and polishing body 54 from the polishing agent supply unit. That is to say, an effective polishing is afforded by a synergistic action of the chemical action of the polishing agent and the mechanical polishing produced by the relative movement of the polishing tool 51 and the wafer W.

Figure 3B:
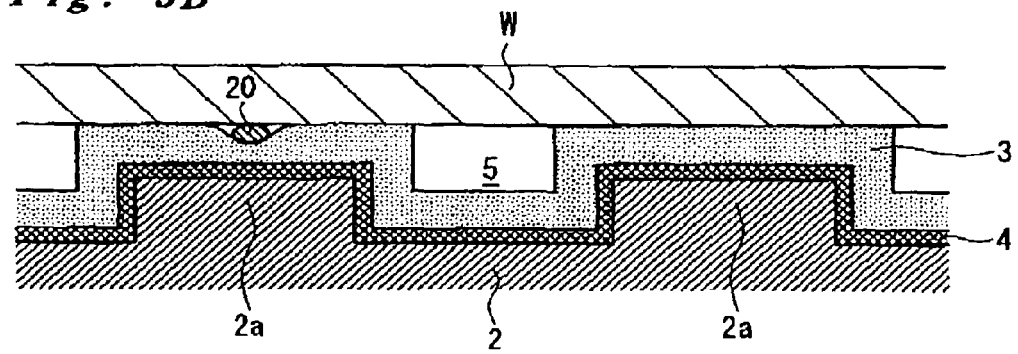
FIG. 3B is a schematic cross-sectional view that schematically shows a state in which a wafer is suctioned in the suction apparatus of FIG. 1 in a case in which there is a foreign material present between the wafer and the suction surface.

According to this embodiment, because either of the suction apparatuses 1 or 21 described above may be employed as the wafer chuck 52, even when a foreign material 20 such as dust, polishing agent or polishing sediment or the like as shown in FIG. 3(b) becomes interposed between the wafer W and the coating layer 3, the lower surface of the wafer W is planarly held and there is no bulge generated in the wafer W in proximity of the location of the foreign material 20. Accordingly, the wafer W can be polished properly without being excessively polished in proximity of the location of the foreign material 20 of the wafer W. When a bulge in a wafer W is produced by the foreign material 20 as shown in the FIG. 4 described above, excessive polishing occurs in proximity of the location thereof and results in the production of a defective wafer W.

Accordingly, in this embodiment, localized excessive polishing of the wafer W can be prevented and, in turn, the yield of the wafer W improved.

In addition, according to this embodiment, because one of either of the suction apparatuses 1, 21 as described above is employed as the wafer chuck 52, the coating layer 3 can be made comparatively thinner and, as a result, even if a condition in which a different force is applied to the various areas of the section of the upper surface of the protrusions 2a, 2b of the coating layer 3 is generated, because there is essentially no difference in the thickness of these areas, undulations in the wafer W can be reduced and, to that end, the planarization of the wafer W in the suctioned state can be improved. When undulations are formed in a wafer W localized excessive polishing of the wafer W occurs and a defective wafer W is produced. Accordingly, in this embodiment, localized excessive polishing of the wafer W can be prevented and, in turn, the yield of the wafer W improved.

FOURTH EXAMPLE

Figure 7:
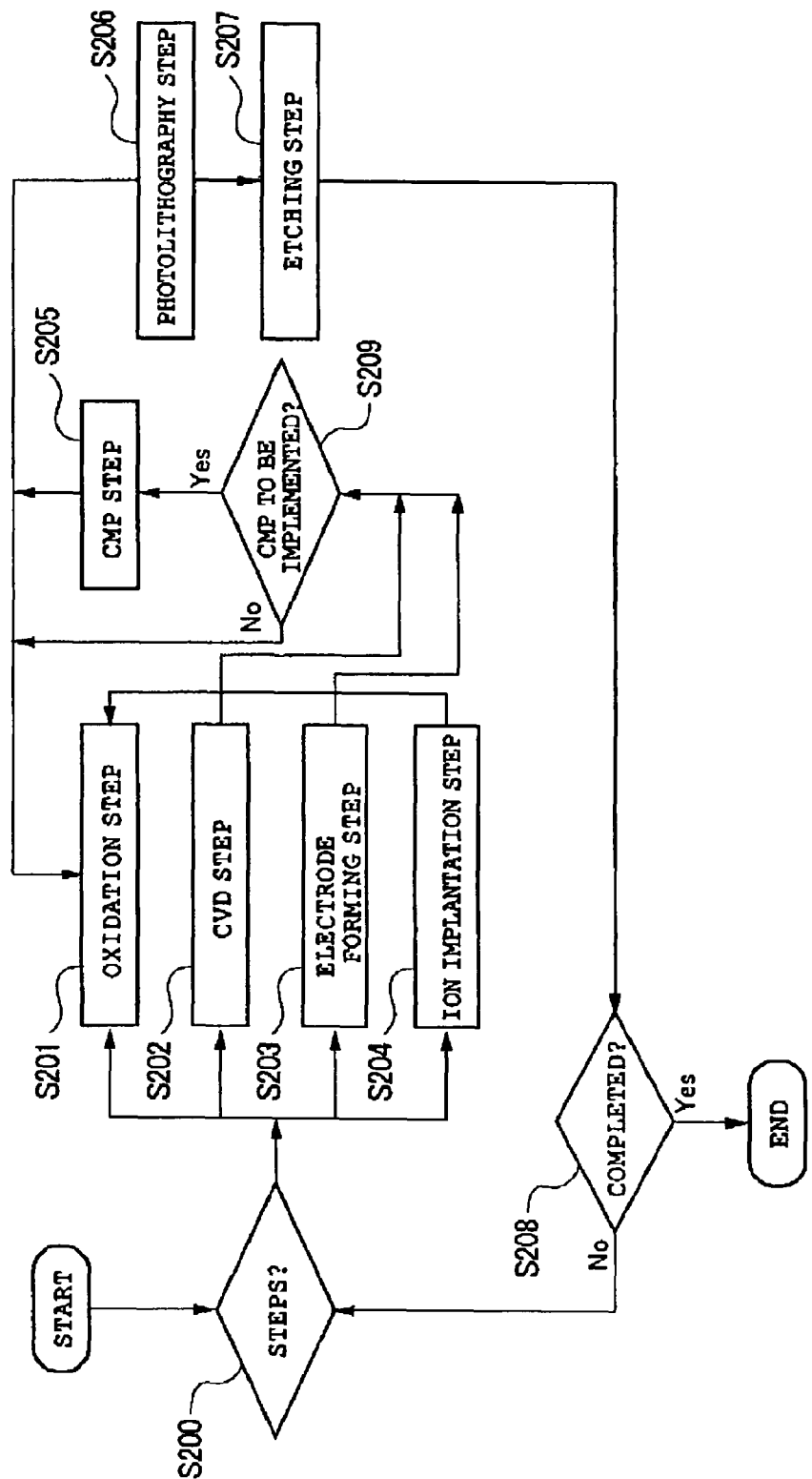
FIG. 7 is a flow chart of the semiconductor device manufacturing process.

An embodiment of a method of manufacturing a semiconductor device pertaining to the present invention will be hereinafter described. FIG. 7 is a flowchart of the semiconductor device manufacturing process. When the semiconductor manufacturing process is started; first, in a Step S200, a suitable processing step is selected from among later-described Steps S201 to S204. The process advances to one of the Steps S201 to S204 in accordance with this selection.

Step S201 is an oxidation step for oxidizing the surface of a wafer. Step S202 is a CVD step for fabricating an insulation film or dielectric film on the wafer surface using a CVD or the like. Step S203 is a electrode-forming step for fabricating an electrode on the wafer by vapor-deposition or the like. Step S204 is an ion impregnation step for impregnating a wafer with ions.

Subsequent to the CVD step (S202) or electrode-forming Step (S203) being performed, the process advances to Step S209 where a judgment as to whether or not a CMP step is to be performed is made. If not the process advances to Step S206, and if so the process advances to Step S205. The Step S205 is a CMP step, and in this step, employing the polishing apparatus based on the present invention or the polishing method of the present invention, a damascene structure is fabricated by planarizing an inter-layered insulation film and polishing the metal film of the surface of the semiconductor device, and polishing the dielectric film and so on.

Subsequent to the CMP step (S205) or oxidation step (S201) being performed, the process advances to Step S206. Step S206 is a photolithography step. In this step, a resist is coated on the wafer, a circuit pattern is printed onto the wafer by exposure employing an exposure device, and the exposed wafer is developed. The following Step S207 is an etching step in which the portion apart from the developed resist image is removed by etching, the resist is then peeled off, and the unnecessary resist following completion of the etching is removed.

Next, in Step S208, a judgment of whether or not all necessary steps have been completed is made and, if ail steps have not yet been completed, the process returns to Step S200 and the previous steps are repeated to fabricate a circuit pattern on the wafer. If all steps are judged to have been completed in Steps S208 the process ends.

Because the polishing apparatus pertaining to the present invention is employed in the CMP step of the method of manufacturing a semiconductor device pertaining to the present invention, the semiconductor device can be manufactured at a lower cost and better yield. In addition, because the semiconductor device pertaining to the present invention is manufactured by the method of manufacturing a semiconductor device pertaining to the present invention, a low cost semiconductor device can be manufactured with better yield. The polishing apparatus of the present invention may be employed in CMP steps of semiconductor device manufacturing processes other than the semiconductor device manufacturing process described above.

While preferred embodiments of the present invention have been described above, present invention should not be regarded as being limited thereto.

For example, the suction apparatus of the present invention can be employed in various other devices including a photographic exposure device (Stepper) and spin coating device. In addition, the material to be suctioned by the suction apparatus of the present invention is not limited to a wafer, and it may be configured to suction various substrates and other materials to be suctioned other than a wafer.

What is claimed is:

1. A suction apparatus for holding a material by vacuum-suctioning, comprising:
    a rigid suction substrate comprising a plurality of protrusions formed on a side to which the material is held by vacuum suctioning, tip-end faces of the plurality of protrusions being formed substantially at the same height; and
    at least one elastic coating layer coated on the suction substrate on the side to which the material is held, wherein a thickness of the elastic coating layer at the tip-end faces of the plurality of protrusions is not less than 20 μm and not more than 80 μm, and the thickness of the elastic coating layer at the tip-end faces of the plurality of protrusions is thinner relative to the elastic coating layer applied elsewhere.

2. The suction apparatus according to claim 1, further comprising at least one undercoat layer coated on the suction substrate such that the undercoat layer is between the elastic coating layer and the suction substrate, wherein the undercoat layer and the elastic coating layer conform to the shape of the substrate.

3. The suction apparatus according to claim 1, wherein the elastic coating layer is formed by polishing at the tip-end faces so as to have the thickness.

4. The suction apparatus according to claim 2, wherein a combined thickness of the elastic coating layer and the undercoat layer is not less than 40 μm and not more than 90 μm.

5. The suction apparatus according to claim 1, wherein the elastic coating layer is configured from paint film.

6. The suction apparatus according to claim 1, wherein at least an uppermost layer of the elastic coating layer is configured from a polyurethane-based resin, or acrylic-based resin or fluorine-based resin.

7. The suction apparatus according to claim 1, wherein a pencil hardness of the elastic coating layer according to JIS K5600-5-4 is substantially H.

8. The suction apparatus according to claim 1, wherein the plurality of protrusions are formed in a pin shape or as ridges.

9. The suction apparatus according to claim 1, wherein the rigid suction substrate is a ceramic.

10. The suction apparatus according to claim 9, wherein the ceramic is alumina.

11. A suction apparatus for holding a material by vacuum-suctioning, comprising:
    a rigid suction substrate comprising a plurality of protrusions formed on a side to which the material is held by vacuum suctioning, tip-end faces of the plurality of protrusions being formed substantially at the same height; and at least one elastic coating layer coated on the suction substrate on the side to which the material is held, the elastic coating layer being configured from a polyurethane-based resin or acrylic-based resin or fluorine-based resin, wherein a thickness of the elastic coating layer at the tip-end faces of the plurality of protrusions is thinner relative to the elastic coating layer applied elsewhere.

12. The suction apparatus according to claim 11, further comprising at least one undercoat layer coated on the suction substrate such that the undercoat layer is between the elastic coating layer and the suction substrate, wherein the undercoat layer and the elastic coating layer conform to the shape of the substrate.

13. The suction apparatus according to claim 11, wherein the elastic coating layer is formed by polishing at the tip-end faces.

14. The suction apparatus according to claim 12, wherein a combined thickness of the elastic coating layer and the undercoat layer is not less than 40 μm and not more than 90 μm.

15. The suction apparatus according to claim 11, wherein the elastic coating layer is configured from a paint film.

16. The suction apparatus according to claim 11, wherein a pencil hardness of the elastic coating layer according to JIS K5600-5-4 is substantially H.

17. The suction apparatus according to claim 11, wherein the plurality of protrusions are formed in a pin shape or as ridges.

18. The auction apparatus according to claim 11, wherein the rigid suction substrate is a ceramic.

19. The suction apparatus according to claim 18, wherein the ceramic is alumina.

20. A suction apparatus for holding a material by vacuum-suctioning, comprising:
a rigid suction substrate comprising a plurality of protrusions formed on a side to which the material is held by vacuum suctioning, tip-end faces of the plurality of protrusions being formed substantially at the same height; and
at least one elastic coating layer coated on the suction substrate on the side to which the material is held, the elastic coating layer being configured from a non-bead containing material, wherein a thickness of the elastic coating layer at the tip-end faces of the plurality of protrusions is thinner relative to the elastic coating layer applied elsewhere.

21. The suction apparatus according to claim 20, further comprising at least one undercoat layer coated on the suction substrate such that the undercoat layer is between the elastic coating layer and the suction substrate, wherein the undercoat layer and the elastic coating layer conform to the shape of the substrate.

22. The suction apparatus according to claim 20, wherein the elastic coating layer is formed by polishing at the tip-end faces.

23. The suction apparatus according to claim 21, wherein a combined thickness of the elastic coating layer and the undercoat layer is not less than 40 μm and not more than 90 μm.

24. The suction apparatus according to claim 20, wherein the elastic coating layer is configured from a paint film.

25. The suction apparatus according to claim 20, wherein a pencil hardness of the elastic coating layer according to JIS K5600-5-4 is substantially H.

26. The suction apparatus according to claim 20, wherein the plurality of protrusions are formed in a pin shape or as ridges.

27. The suction apparatus according to claim 20, wherein the rigid suction substrate is a ceramic.

28. The suction apparatus according to claim 27, wherein the ceramic is alumina.

29. A method of manufacturing a suction apparatus having a rigid suction substrate with a plurality of protrusions formed on a side to which a material is held by vacuum suctioning, comprising:
applying an elastic coating layer on the suction substrate on the side to which the material is held, wherein a thickness of the elastic coating layer at tip-end faces of the plurality of protrusions is greater than 20 μm and smaller than 80 μm, and the thickness of the elastic coating layer at the tip-end faces of the plurality of protrusions is thinner relative to the elastic coating layer applied elsewhere.

30. The method according to claim 29, further comprising:
applying an undercoat layer on the suction substrate such that the undercoat layer is between the elastic coating layer and the suction substrate, wherein the undercoat layer and the elastic coating layer conform to the shape of the substrate.

31. The method according to claim 30, wherein the elastic coating layer is formed by polishing at the tip-end faces so as to have the thickness.

32. The method according to claim 29, wherein the elastic coating layer is applied a plurality of times.

33. The method according to claim 30, wherein a combined thickness of the elastic coating layer and the undercoat layer is not less than 40 μm and not more than 90 μm.

34. The method according to claim 33, wherein the combined thickness of the undercoat layer and the elastic coating layer is not less than 60 μm and not more than 80 μm.

35. The method according to claim 31, further comprising washing the polished layer.

36. A method of manufacturing a suction apparatus having a rigid suction substrate with a plurality of protrusions formed on a side to which a material is held by vacuum suctioning, comprising:
applying an elastic coating layer on the suction substrate on the side to which the material is held, and
polishing the elastic coating layer at tip-end faces of the plurality of Protrusions, wherein a thickness of the elastic coating layer at the tip end faces of the plurality of protrusions is thinner relative to the elastic coating layer applied elsewhere.

37. The method according to claim 36, wherein a thickness of the elastic coating layer at the tip-end faces of the plurality of protrusions is greater than 20 μm and smaller than 80 μm.

38. The method according to claim 36, further comprising:
applying an undercoat layer on the suction substrate such that the undercoat layer is between the elastic coating layer and the suction substrate, wherein the undercoat layer and the elastic coating layer conform to the shape of the substrate.

39. The method according to claim 36, wherein the elastic costing layer is applied a plurality of times.

40. The method according to claim 38, wherein a combined thickness of the elastic coating layer and the undercoat layer is not less than 40 μm and not more than 90 μm.

41. The method of claim 40, wherein the combined thickness of the undercoat layer and the elastic coating layer is not less than 40 μm and not more than 90 μm.

42. The method of claim 36, further comprising washing the polished layer.

43. A method of manufacturing a suction apparatus having a rigid suction substrate with a plurality of protrusions formed on a side to which a material is held by vacuum suctioning, comprising:
applying an elastic coating layer on the suction substrate on the side to which the material is held, wherein the elastic coating layer conforms to shape of the substrate, and the elastic coating layer is configured from a polyurethane-based resin or acrylic-based resin or fluorine-based resin, wherein a thickness of the elastic coating layer at tip-end faces of the plurality of protrusions is thinner relative to the elastic coating layer applied elsewhere.

44. The method according to claim 43, further comprising:
applying an undercoat layer on the suction substrate such that the undercoat layer is between the elastic coating layer and the suction substrate, wherein the undercoat layer and the elastic coating layer conform to the shape of the substrate.

45. The method according to claim 43, wherein the elastic coating layer is formed by polishing at the tip-end face.

46. The method according to claim 43, wherein the elastic coating layer is applied a plurality of times.

47. The method according to claim 44, wherein a combined thickness of the elastic coating layer and the undercoat layer is not less than 40 μm and not more than 90 μm.

48. The method according to claim 44, wherein the combined thickness of the undercoat layer and the elastic coating layer is 60-80 μm.

49. The method according to claim 43, further comprising washing the polished layer.

50. A method of manufacturing a suction apparatus having a rigid suction substrate with a plurality of protrusions formed on a side to which a material is held by vacuum suctioning, comprising:
applying an elastic coating layer on the suction substrate on the side to which the material is held, the elastic coating layer confirming to the shape of the substrate, wherein the elastic coating layer is configured from a non-bead containing material, and a thickness of the elastic coating layer at tip-end faces of the plurality of protrusions is thinner relative to the elastic coating layer applied elsewhere.

51. The method according to claim 50, further comprising:
applying an undercoat layer on the suction substrate such that the undercoat layer is between the elastic coating layer and the suction substrate, wherein the undercoat layer and the elastic coating layer conform to the shape of the substrate.

52. The method according to claim 50, wherein the elastic coating layer is formed by polishing at the tip-end faces.

53. The method according to claim 50, wherein the elastic coating layer is applied a plurality of times.

54. The method according to claim 51, wherein a combined thickness of the elastic coating layer and the undercoat layer is not less than 40 μm and not more than 90 μm.

55. The method according to claim 51, wherein the combined thickness of the undercoat layer and the elastic coating layer is 60-80 μm.

56. The method according to claim 50, further comprising washing the polished layer.

* * * * *